(12) United States Patent
Jo et al.

(10) Patent No.: US 11,844,173 B2
(45) Date of Patent: Dec. 12, 2023

(54) FLEXIBLE CIRCUIT BOARD FOR MULTIPLE SIGNAL TRANSMISSION

(71) Applicant: GigaLane Co., Ltd., Hwaseong-si (KR)

(72) Inventors: Byung-hoon Jo, Hwaseong-si (KR); Ik-soo Kim, Hwaseong-si (KR); Byung-yeol Kim, Hwaseong-si (KR); Hee-seok Jung, Hwaseong-si (KR)

(73) Assignee: GIGALANE CO., LTD., Hwaseong-si (KR)

(*) Notice: Subject to any disclaimer, the term of this patent is extended or adjusted under 35 U.S.C. 154(b) by 10 days.

(21) Appl. No.: 17/478,987

(22) Filed: Sep. 20, 2021

(65) Prior Publication Data

US 2022/0183143 A1   Jun. 9, 2022

(30) Foreign Application Priority Data

Dec. 3, 2020   (KR) .................. 10-2020-0167355
Apr. 26, 2021  (KR) .................. 10-2021-0053701

(51) Int. Cl.
*H05K 1/02* (2006.01)
*H05K 1/11* (2006.01)
*H05K 1/03* (2006.01)

(52) U.S. Cl.
CPC ........... *H05K 1/0219* (2013.01); *H05K 1/028* (2013.01); *H05K 1/115* (2013.01); *H05K 1/024* (2013.01); *H05K 1/0224* (2013.01); *H05K 1/0245* (2013.01); *H05K 1/0393* (2013.01)

(58) Field of Classification Search
CPC ...... H05K 1/0219; H05K 1/028; H05K 1/115; H05K 1/0218; H05K 1/0245; H05K 2201/068; H05K 2201/09336; H05K 2201/0969; H05K 1/0224; H05K 1/0206; H05K 1/0228; H05K 1/024; H05K 1/0298; H05K 2201/05

See application file for complete search history.

(56) References Cited

U.S. PATENT DOCUMENTS 5,003,273 A * 3/1991 Oppenberg .......... H05K 1/0219
                                                         174/117 FF
6,040,524 A * 3/2000 Kobayashi .......... H05K 1/0219
                                                         174/262

(Continued)

FOREIGN PATENT DOCUMENTS

JP       H05136597 A    6/1993
JP       H07099397 A    4/1995

(Continued)

OTHER PUBLICATIONS

Notice of Reasons for Refusal, Japanese Patent Application No. 2021-149900, dated Sep. 6, 2022.

*Primary Examiner* — Ishwarbhai B Patel
(74) *Attorney, Agent, or Firm* — Shih IP Law Group, PLLC.

(57) ABSTRACT

The present disclosure provides a flexible circuit board for multiple signal transmission including a first dielectric layer; a plurality of first side grounds formed on one surface of the first dielectric layer to be parallel; first signal lines formed between the plurality of first side grounds; and a plurality of through holes which is formed in each of the plurality of first side grounds with an interval, along a length direction of the first side grounds.

23 Claims, 10 Drawing Sheets

(56) References Cited

U.S. PATENT DOCUMENTS

| | | | | |
|---|---|---|---|---|
| 6,835,897 | B2* | 12/2004 | Chang | H01L 23/49838 |
| | | | | 174/254 |
| 7,145,411 | B1* | 12/2006 | Blair | H01P 3/006 |
| | | | | 333/247 |
| 2010/0258338 | A1* | 10/2010 | Hsu | H05K 1/0253 |
| | | | | 174/254 |
| 2014/0139300 | A1 | 5/2014 | Brown | |
| 2019/0394870 | A1* | 12/2019 | Mori | H05K 1/0218 |

FOREIGN PATENT DOCUMENTS

| | | |
|---|---|---|
| JP | H1041630 A | 2/1998 |
| JP | 2001028506 A | 1/2001 |
| JP | 2003204128 A | 7/2003 |
| JP | 2006245863 A | 9/2006 |
| JP | 2007123740 A | 5/2007 |
| JP | 2010530690 A | 9/2010 |
| JP | 2012138471 A | 7/2012 |
| JP | 2018125491 A | 8/2018 |
| JP | 2019516231 A | 6/2019 |
| KR | 1020180037914 A | 4/2018 |
| KR | 1020180080611 A | 7/2018 |
| KR | 101938106 B1 | 1/2019 |
| WO | 2017138744 A1 | 8/2017 |

* cited by examiner

FLEXIBLE CIRCUIT BOARD FOR MULTIPLE SIGNAL TRANSMISSION

CROSS-REFERENCE TO RELATED APPLICATIONS

This application claims the benefit of Korean Patent Application Nos. KR 10-2020-0167355 filed on Dec. 3, 2020 and KR 10-2021-0053701 filed on Apr. 26, 2021, the entire disclosures of which are incorporated herein by reference.

TECHNICAL FIELD

The exemplary embodiments of the present disclosure relate to a flexible circuit board for multiple signal transmission.

BACKGROUND

A base station system includes a digital signal processing unit (digital unit: DU) which is in charge of digital signal processing and an RF signal processing unit (radio unit: RU) which converts a digital signal into an RF signal or converts an RF signal into a digital signal and transmits/receives the converted signal between an antenna and the digital signal processing unit.

A coaxial cable is used for the transmission/reception of the digital signal processing unit and the RF signal processing unit. However, in the recent 5G environment, 100 or more coaxial cables are necessary so that a space for disposing the coaxial cables is expanded, which causes a problem to implement the size reduction.

(Related Art Document) Korean Unexamined Patent Application Publication No. 10-2018-0037914

SUMMARY

The present disclosure is contrived to improve the above-mentioned problem and an object of the present disclosure is to apply a single flexible printed circuit board (FPCB), instead of a plurality of coaxial cables to implement the size reduction. Specifically, a plurality of signal transmission lines is formed on the flexible circuit board, rather than in the coaxial cable, to transmit and receive signals.

Specifically, an object of the present disclosure is to provide a flexible circuit board for multiple signal transmission which may minimize the defect during the process while improving a signal quality and minimizing a size and an area.

However, the object is just illustrative, but the scope of the present disclosure is not limited thereby.

A flexible circuit board for multiple signal transmission according to an embodiment of the present disclosure includes a first dielectric layer; a plurality of first side grounds formed on one surface of the first dielectric layer to be parallel; a plurality of first signal lines formed between the plurality of first side grounds; and a plurality of through holes which is formed in each of the plurality of first side grounds with an interval, along a length direction of the first side grounds, and in which one area of one surface, among surfaces of the first dielectric layer, on which the first side ground is formed is exposed through the plurality of through holes.

According to an embodiment, each of the plurality of first signal lines is formed by one or two or more signal lines.

According to an embodiment, each of the plurality of through holes has a slit shape elongating along the length direction.

According to an embodiment, the plurality of through holes formed in at least one of the plurality of first side grounds is disposed in one line.

According to an embodiment, centers of the through holes formed in an arbitrary first side ground and centers of the through holes formed in the other first side ground adjacent to the arbitrary first side ground are not disposed on the same straight line parallel to the width direction of the first side ground.

According to an embodiment, the flexible circuit board for multiple signal transmission further includes a plurality of second side grounds formed on a bottom surface of the first dielectric layer; and a second dielectric layer formed on bottom surfaces of the plurality of second side grounds.

According to an embodiment, the second side grounds are formed below an area where the first side grounds are formed, along the length direction and a cavity line is formed between the second side grounds and below the area where the first signal lines are formed.

According to an embodiment, a flexible circuit board for multiple signal transmission includes a first dielectric layer; a plurality of first side grounds formed on one surface of the first dielectric layer to be parallel; a plurality of first signal lines formed between the plurality of first side grounds; and a plurality of second side grounds formed on a bottom surface of the first dielectric layer; and a second dielectric layer formed on bottom surfaces of the plurality of second side grounds, and the second side grounds are formed below an area where the first side grounds are formed, a cavity line is formed between the second side grounds and below the area where the first signal lines are formed, and the cavity line includes at least two cavity lines which are spaced apart from each other with respect to a direction intersecting the length direction of the first signal line.

According to an embodiment, a flexible circuit board for multiple signal transmission includes a first dielectric layer; a plurality of first side grounds formed on one surface of the first dielectric layer to be parallel; a plurality of first signal lines formed between the plurality of first side grounds; and a plurality of second side grounds formed on a bottom surface of the first dielectric layer; and a second dielectric layer formed on bottom surfaces of the plurality of second side grounds, and the second side grounds are formed below an area where the first side grounds are formed, along the length direction of the first side grounds, a cavity line is formed between the second side grounds and below the area where the first signal lines are formed, and the cavity line is formed to extend along the length direction of the first signal line.

According to an embodiment, the cavity line is an empty space formed to be enclosed by the second side grounds, the first dielectric layer, and the second dielectric layer.

According to an embodiment, a plurality of through holes is formed in each of the second side grounds along the length direction with an interval therebetween.

According to an embodiment, the flexible circuit board for multiple signal transmission further includes a third dielectric layer facing one surface of the first dielectric layer; and an upper ground formed on one surface of the third dielectric layer.

According to an embodiment, a plurality of through holes is formed on the upper ground.

According to an embodiment, the through holes are not formed in a portion of the upper ground on the area where the first signal line is formed and the through holes are formed in a portion of the upper ground on the area where the first signal line is not formed.

According to an embodiment, the flexible circuit board for multiple signal transmission further includes a lower ground formed on a bottom surface of the second dielectric layer.

According to an embodiment, the flexible circuit board for multiple signal transmission further includes a fourth dielectric layer formed on a bottom surface of the lower ground; a plurality of third side grounds formed on a bottom surface of the fourth dielectric layer to be parallel; and a plurality of second signal lines formed between the plurality of third side grounds.

According to an embodiment, a plurality of through holes is formed in each of the third side grounds along the length direction with an interval therebetween.

According to an embodiment, each of the plurality of second signal lines is formed by one or two or more signal lines.

According to an embodiment, a plurality of through holes is formed on the lower ground, the through holes are not formed in a portion of the lower ground on the area where the plurality of second signal lines is formed, and the through holes are formed in a portion of the lower ground on the area where the plurality of second signal lines is not formed.

According to an embodiment, one of the plurality of first signal lines and the plurality of second signal lines is a signal line for high speed signal transmission and the other one is a signal line for low speed signal transmission.

According to an embodiment, both ends of the plurality of first signal lines are connected to a digital signal processing unit and an RF signal processing unit, respectively.

According to an embodiment, a plurality of first signal lines disposed in a central area of the flexible circuit board is signal lines for high speed signal transmission and a plurality of first signal lines disposed in an outer area of the flexible circuit board is signal lines for low speed signal transmission.

According to an embodiment, intervals between the signal lines for high speed signal transmission are larger than intervals between the signal lines for low speed signal transmission.

According to an embodiment, a width of a first side ground formed between the signal lines for high speed signal transmission, among the plurality of first side grounds is larger than a width of a first side ground formed between the signal lines for low speed signal transmission.

According to an embodiment, the through holes are formed in the first side ground formed between the signal lines for high speed signal transmission, among the plurality of first side grounds, and the through holes are not formed in the first side ground formed between the signal lines for low speed signal transmission, among the plurality of first side grounds.

Other aspects, features, and advantages other than those described above will become apparent from the following drawings, claims, and the detailed description of the present disclosure.

Advantageous Effects

According to the exemplary embodiment of the present disclosure as described above, the defect during the process may be minimized while improving a signal quality of a flexible circuit board for multiple signal transmission and minimizing a size and an area.

However, the scope of the present disclosure is not limited by the effects.

BRIEF DESCRIPTION OF DRAWINGS

Exemplary embodiments of the present disclosure will be described with reference to the accompanying drawings described below, and similar reference numerals denote similar elements, but the present disclosure is not limited thereto.

DETAILED DESCRIPTION

Figure 1:
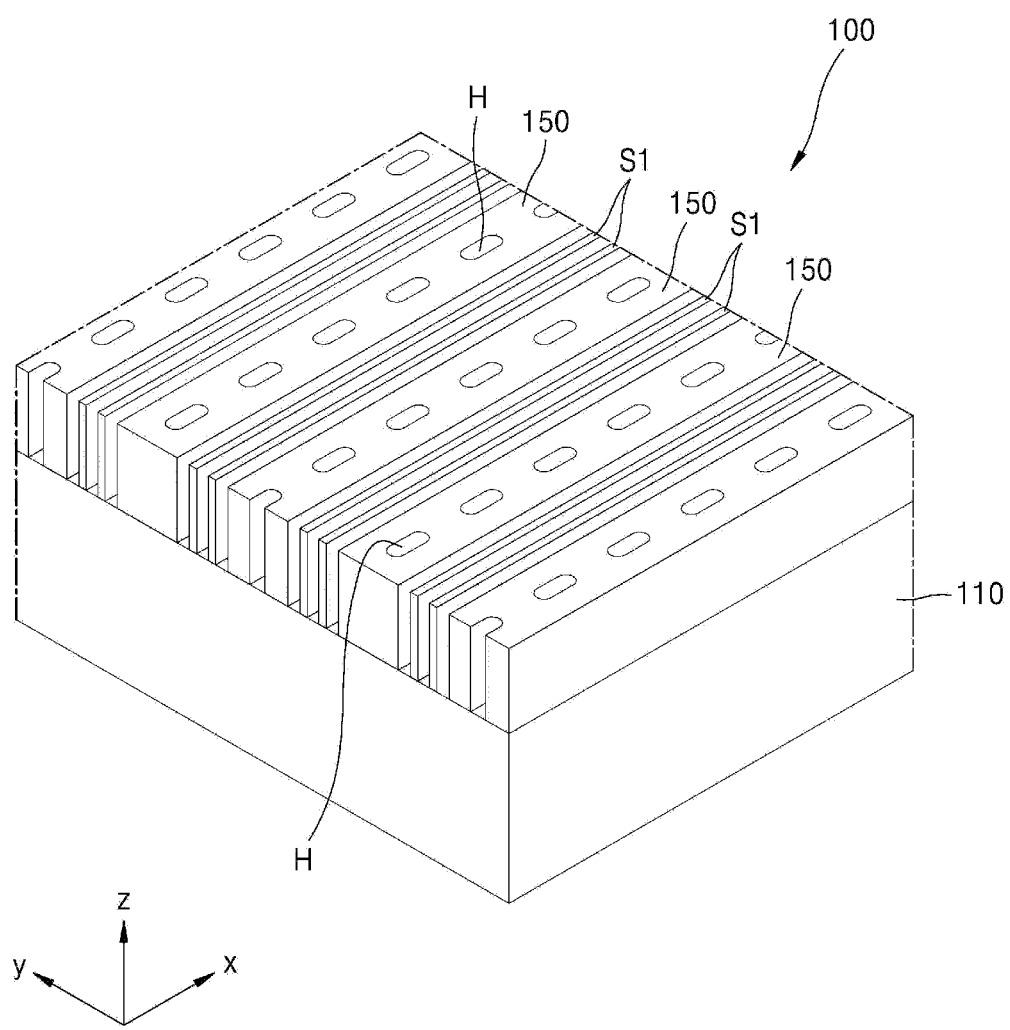
FIG. 1 is a perspective view of a flexible circuit board 100 for multiple signal transmission according to an exemplary embodiment of the present disclosure.

Those skilled in the art may make various modifications to the present disclosure and the present disclosure may have various embodiments thereof, and thus specific embodiments will be illustrated in the drawings and described in detail in detailed description. Advantages and characteristics of the present disclosure and a method of achieving the advantages and characteristics will be clear by referring to exemplary embodiments described below in detail together with the drawings. However, the present disclosure is not limited to an embodiment disclosed below and may be implemented in various forms.

Hereinafter, exemplary embodiments according to the present disclosure will be described in detail with reference to the accompanying drawings, and the same or corresponding constituent elements are denoted by the same reference numerals regardless of a sign of the drawing, and repeated description thereof will be omitted.

In the following exemplary embodiment, the terms such as "first" or "second" are used for the purpose of distinguishing one component from another, not in a limiting sense.

In the following exemplary embodiment, a singular form includes a plural form if there is no clearly opposite meaning in the context.

In the following exemplary embodiment, terms such as includes or have means that a feature or a component described in the specification is present, but do not exclude in advance a possibility that one or more other features or components will be added.

In the drawings, for the convenience of description, sizes of the components may be exaggerated or reduced. For example, the size and thickness of the components shown the drawings are optionally determined for better understanding and ease of description, and the present disclosure is not necessarily limited to the examples shown in the drawings.

In the following exemplary embodiment, when it is described that a part such as a region, a layer, or a component is disposed "on" or "above" the other part, it is not only immediately on the other part, but also a third region, layer, or component is interposed between the above two parts.

In the following exemplary embodiments, when components are connected, the components are not only directly connected, but also indirectly connected with other components interposed therebetween.

FIG. 1 is a perspective view of a flexible circuit board 100 for multiple signal transmission according to an exemplary embodiment of the present disclosure.

Referring to FIG. 1, a flexible circuit board 100 for multiple signal transmission according to an exemplary embodiment of the present disclosure includes a first dielectric layer 110, a plurality of first side grounds 150 formed on one surface of the first dielectric layer 110 to be parallel, first signal lines S1 formed between the plurality of first side grounds 150. In each of the plurality of first side grounds 150, a plurality of through holes H is formed with an interval therebetween along a length direction of the first side ground 150.

The first signal lines S1 and the first side grounds 150 may be formed to be parallel to each other. Accordingly, a length direction of the first signal line S1 may be the same as the length direction of the first side ground 150. In the following drawings, an x direction indicates the length direction, a y direction indicates a direction (or a width direction) perpendicular to the length direction of the first signal line S1, and a z direction indicates a direction perpendicular to the flexible circuit board 100. However, the description of the direction is provided to help the explanation of the positional relationship so that it should not be interpreted limitedly and it should be noted that the direction is flexible depending on the direction of the vision.

Generally, when a plurality of signal lines is formed in a flexible circuit board with a limited area, a space between the plurality of signal lines becomes narrow. Further, a ground line for shielding between adjacent signal lines needs to be formed between signal lines so that a space between the signal lines becomes narrower. In this case, during a process of connecting a connector to the flexible circuit board using a surface mount technology (SMT) process, the signal line and the ground line expand due to heat to be conducted.

According to an exemplary embodiment, a plurality of through holes H is formed in each of the first side grounds 150 to restrict the expansion of the first side grounds 150 due to the heat. Specifically, the external shape change of the first side grounds 150 by the thermal expansion of the first side grounds 150 may be minimized, which may prevent the conduction.

According to an exemplary embodiment of the present disclosure, each of the plurality of through holes H may have a slit shape which elongates along the length direction. Since the first side ground 150 has a line shape, when the through hole H is formed to have a slit shape elongating along the length direction of the first side ground 150, the expansion in all directions of the first side ground 150 may be effectively minimized.

According to an exemplary embodiment, the plurality of through holes H formed in one arbitrary first side ground 150 may be disposed in one line. In other words, the plurality of through holes H formed in one arbitrary first side ground 150 may be disposed so as to pass through one axis along the length direction of the first side ground 150. When the plurality of through holes H formed in each of the first side grounds 150 is disposed in one line, a width of the first side ground 150 may be minimized. That is, the size reduction of the flexible circuit board 100 may be achieved.

According to an exemplary embodiment, the through holes H formed in an arbitrary first side ground 150 and through holes H formed in the other first side grounds 150 adjacent to the first side ground 150 may be formed to be zigzagged. In other words, the through holes H formed in the arbitrary first side ground 150 and the through holes H formed in the other first side grounds 150 adjacent to the first side ground 150 may not simultaneously pass through a straight line along the width direction of the first side ground 150. In other words, first through holes H formed in the arbitrary first side ground 150 and second through holes H formed in the other first side grounds 150 adjacent to the first side ground 150 may be disposed so as not to simultaneously pass through a straight line parallel to the width direction of the first side ground 150. In other word again, the plurality of first through holes H formed in the first side ground 150 at one side of the arbitrary first signal line S1 and the plurality of second through holes H formed in the first side ground 150 at the other side of the arbitrary first signal line S1 may be formed to be zigzagged. However, this is merely an exemplary embodiment and the present disclosure is not limited thereto. According to another exemplary embodiment, the first through holes H formed in the arbitrary first side ground 150 and the second through holes H formed in the other first side grounds 150 adjacent to the first side ground 150 may be disposed so as to simultaneously pass through a straight line parallel to the width direction of the first side ground 150. For example, the first through holes H and the second through holes H may be disposed to simultaneously pass through the straight line in the width direction, but the "centers" of the first through holes H and the "centers" of the second through holes H do not simultaneously pass through the straight line. In other words, some of the first through holes H and some of the second through holes H may be disposed to simultaneously pass through the straight line in the width direction, but the "centers" of the first through hole H and the "centers" of the second through hole H may be disposed to be zigzagged.

As described above, the through holes H formed in the arbitrary first side ground 150 and the other first side ground 150 adjacent thereto are formed to be zigzagged to minimize the interference between adjacent first signal lines S1.

Figure 2:
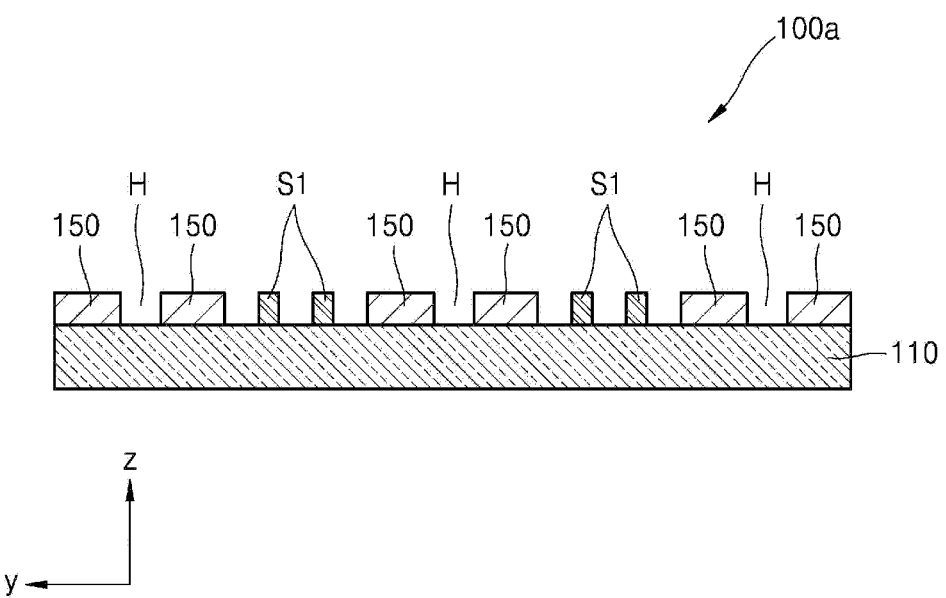
FIG. 2 is a cross-sectional view of a flexible circuit board 100*a* for multiple signal transmission according to an exemplary embodiment of the present disclosure.

FIG. 2 is a cross-sectional view of a flexible circuit board 100a for multiple signal transmission according to an exemplary embodiment of the present disclosure. FIG. 2 illustrates an example in which through holes H formed in the first side grounds 150 are not formed to be zigzagged. In other words, in the embodiment illustrated in FIG. 2, the through holes H formed in the arbitrary first side ground 150 and the through holes H formed in the other first side grounds 150 adjacent to the first side ground 150 may simultaneously pass through a straight line parallel to the width direction (y-axis direction).

According to the exemplary embodiment, the first signal line S1 may be formed by one or two or more signal lines. Referring to FIGS. 1 and 2, each first signal line S1 is formed by two signal lines. When each first signal line S1 is formed by two or more signal lines, even though there is a problem in signal transmission through one signal line, the signal may be transmitted through the other signal line. For example, one signal line and the other signal line may transmit the same signal.

Figure 3:
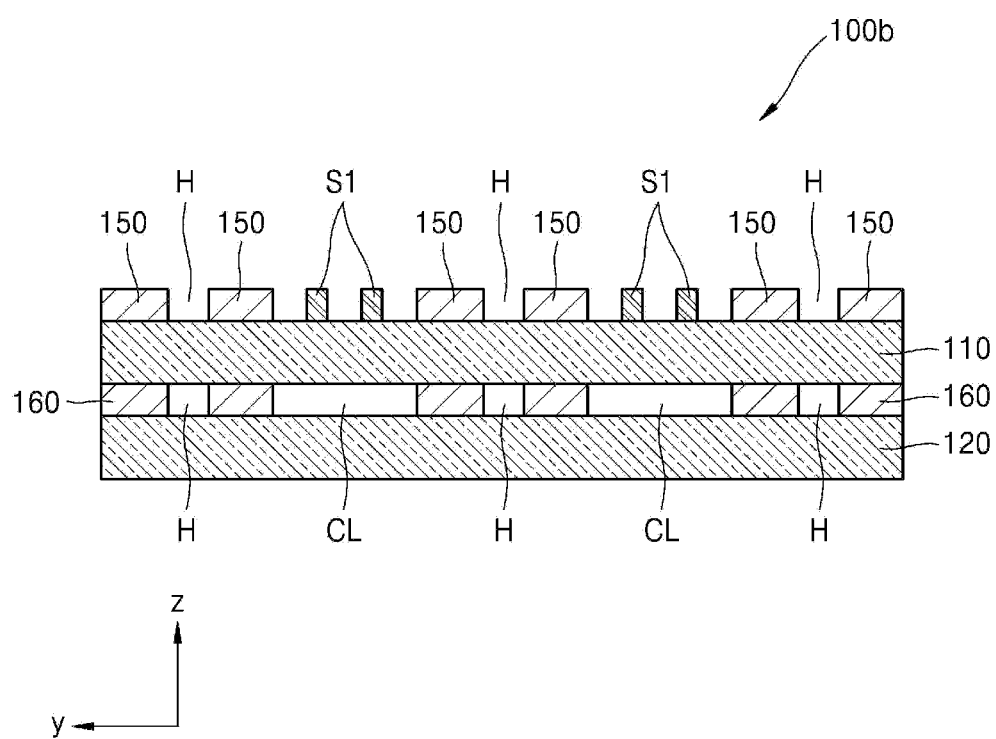
FIG. 3 is a cross-sectional view of a flexible circuit board 100*b* for multiple signal transmission according to an exemplary embodiment of the present disclosure.

FIG. 3 is a cross-sectional view of a flexible circuit board 100*b* for multiple signal transmission according to an exemplary embodiment of the present disclosure.

Referring to FIG. 3, as compared with the above-described flexible circuit board 100*a*, a flexible circuit board 100*b* for multiple signal transmission according to an exemplary embodiment may further include a plurality of second side grounds 160 formed on a bottom surface of the first dielectric layer 110 and a second dielectric layer 120 formed on bottom surfaces of the plurality of second side grounds 160.

The second side grounds 160 formed on the bottom surface of the first dielectric layer 110 helps the shielding of the first signal line S1 and may reduce the signal interference between the first signal lines S1. Further, the second dielectric layer 120 formed on the bottom surfaces of the second side grounds 160 may entirely planarize the flexible circuit board 100*b*.

In the meantime, generally, when a plurality of signal lines is formed on the flexible circuit board, there is a problem in that protrusions are formed in the vicinity of the signal lines of the flexible circuit board due to the height of the signal lines. For example, a part of the dielectric layer which covers or supports the signal line may convexly protrude. When the surface in the vicinity of the signal line protrudes, defects or product damages may be caused. Further, an empty space (gap) is generated in a dielectric space in the vicinity of the signal line, which deteriorates an electrical characteristic of the signal line.

According to an exemplary embodiment of the present disclosure, the second side grounds 160 may be formed below an area where the first side grounds 150 are formed, along the length direction. A cavity line CL may be formed between the second side grounds 160 and below the area where the first signal line S1 is formed. The cavity line CL may be formed below the area where the first signal line S1 is formed, along the area where the first signal line S1 is formed.

The cavity line CL, which is an empty space, is formed below the area where the first signal line S1 is formed to planarize the overall appearance of the flexible circuit board 100*b*. Specifically, even though the bottom surface of the first dielectric layer 110 protrudes due to the height of the first signal line S1, the cavity line CL may accept the protruding portion. Accordingly, the second dielectric layer 120 may be formed to be flat and a surface in the vicinity of the signal line does not protrude in the flexible circuit board 100*b*. In the meantime, the second side grounds 160 formed below the area where the first side grounds 150 are formed may support the peripheral portion of the cavity line CL and allow the flexible circuit board 100*b* to entirely have a flat appearance.

According to an exemplary embodiment, a plurality of through holes H which is formed with intervals along the length direction may be formed in each of the second side grounds 160. The plurality of through holes H formed in each of the second side grounds 160 may minimize the appearance change due to the thermal expansion of the second side ground 160.

Figure 4:
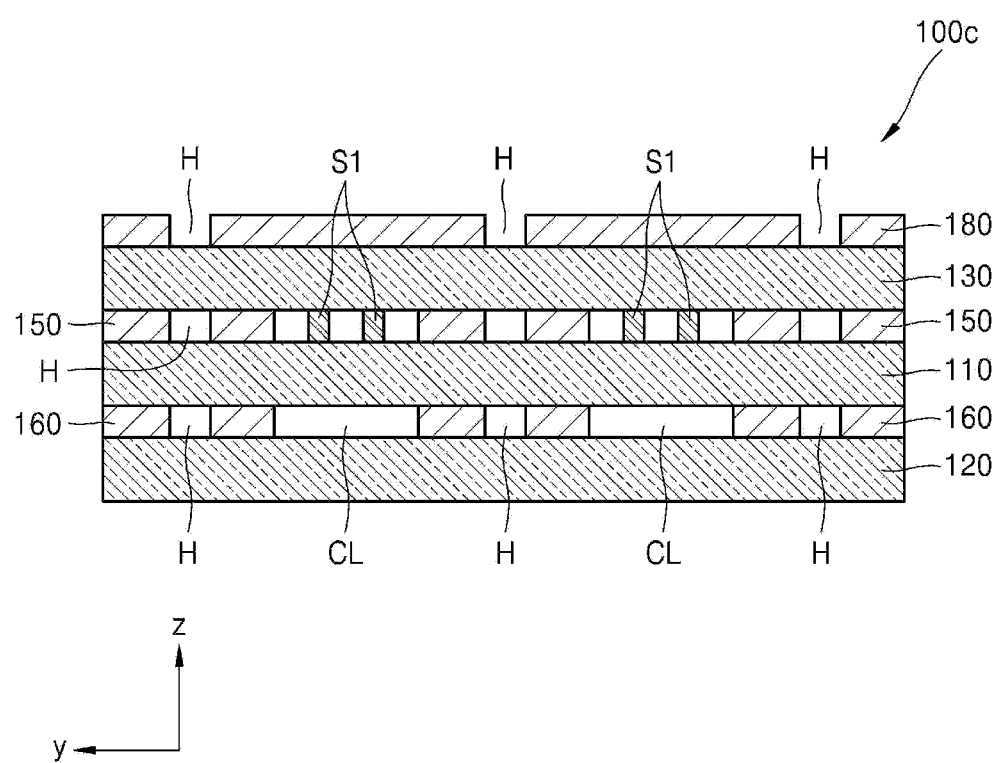
FIG. 4 is a cross-sectional view of a flexible circuit board 100*c* for multiple signal transmission according to an exemplary embodiment of the present disclosure.

FIG. 4 is a cross-sectional view of a flexible circuit board 100*c* for multiple signal transmission according to an exemplary embodiment of the present disclosure.

Referring to FIG. 4, as compared with the above-described flexible circuit board 100*b*, the flexible circuit board 100*c* for multiple signal transmission according to an exemplary embodiment of the present disclosure may further include a third dielectric layer 130 facing one surface of the first dielectric layer 110 and an upper ground 180 formed on one surface of the third dielectric layer 130. The upper ground 180 shields the first signal line S1 and may reduce the interference of the first signal lines S1.

The upper ground 180 is formed in a planar shape as a whole so that when a heat is applied thereto during the process, the thermal expansion may be significant. For example, there may be a problem in that the upper ground 180 expands to be bumpy or bent.

In order to solve this problem, according to an exemplary embodiment, a plurality of through holes H may be formed on the upper ground 180. The plurality of through holes H is formed on the upper ground 180 to minimize the deformation of the planar shaped upper ground 180 due to the thermal expansion.

Figure 9:
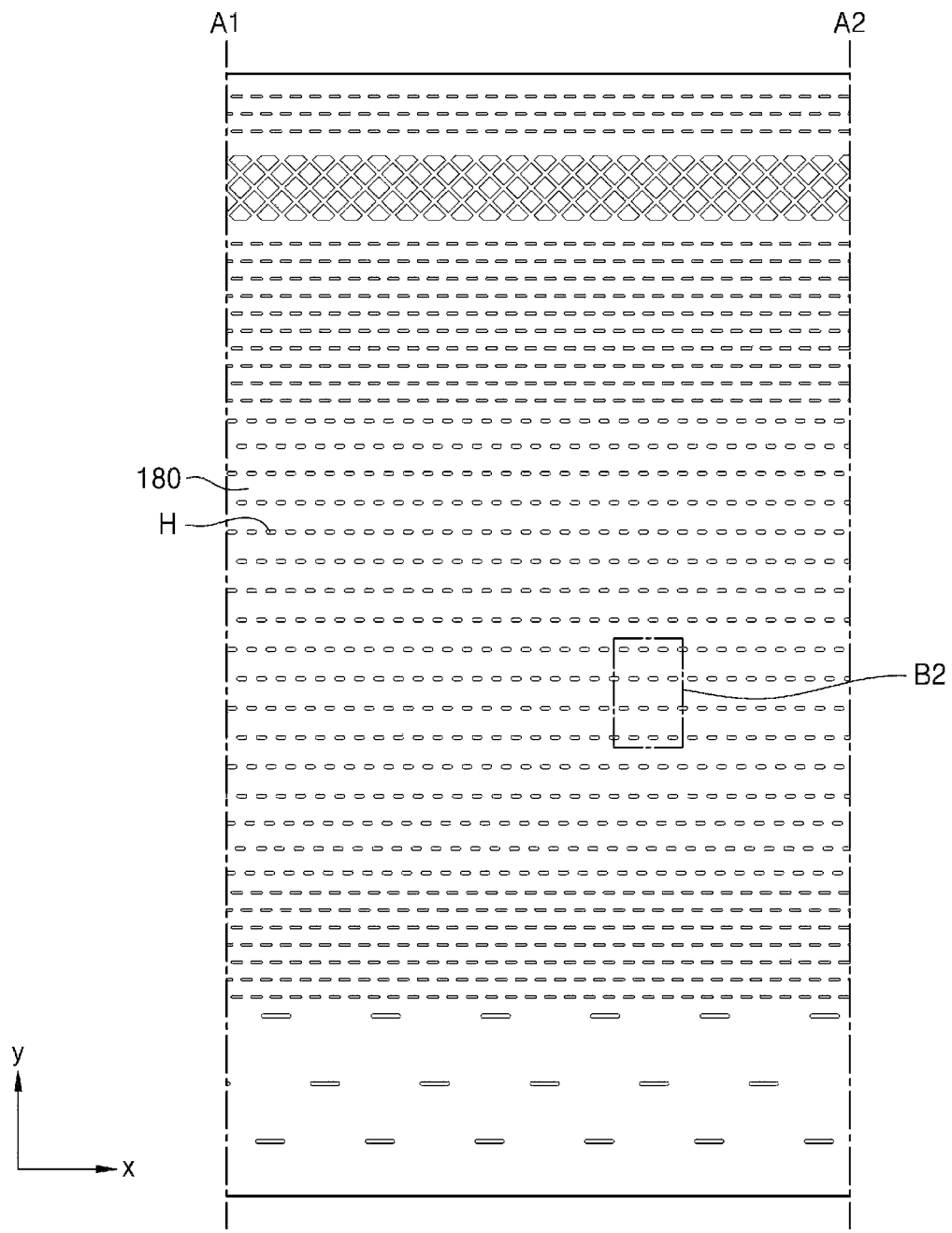
FIG. 9 is a top view of an upper ground 180 according to an exemplary embodiment of the present disclosure.

An example that the plurality of through holes H is formed on the upper ground 180 is as illustrated in FIG. 9. FIG. 9 is a top view of an upper ground 180 according to an exemplary embodiment of the present disclosure.

Figure 5:
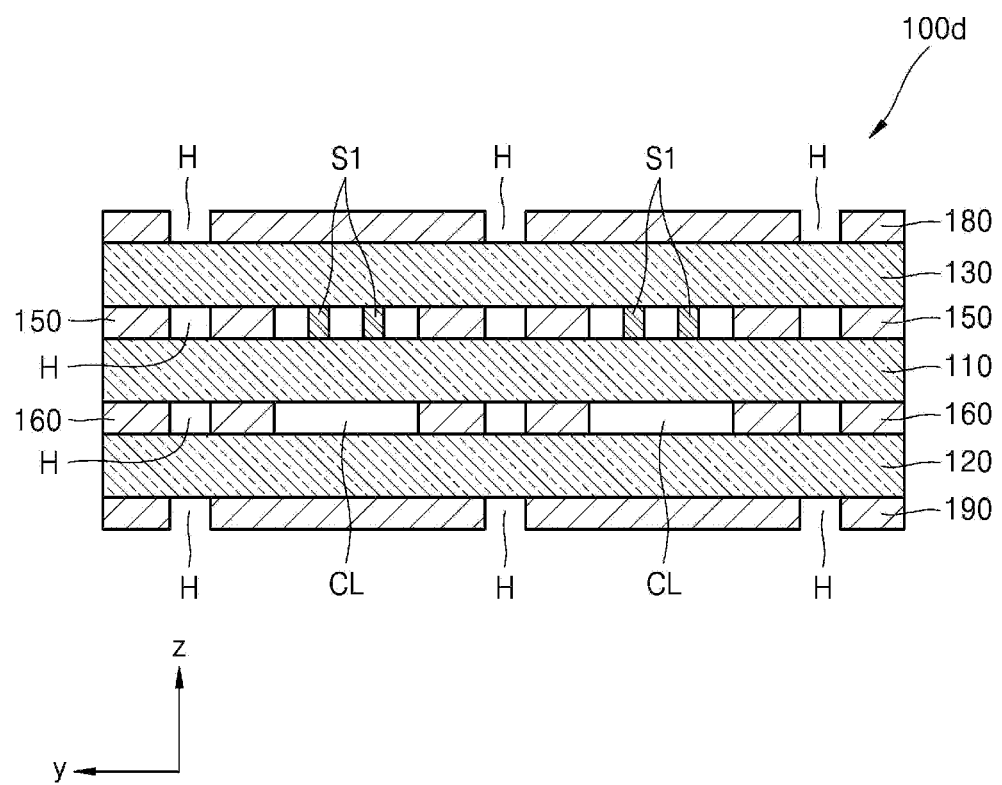
FIG. 5 is a cross-sectional view of a flexible circuit board 100*d* for multiple signal transmission according to an exemplary embodiment of the present disclosure.

FIG. 5 is a cross-sectional view of a flexible circuit board 100*d* for multiple signal transmission according to an exemplary embodiment of the present disclosure.

Referring to FIG. 5, the flexible circuit board 100*d* for multiple signal transmission according to the exemplary embodiment may further include a lower ground 190 formed on the bottom surface of the second dielectric layer 120, in the flexible circuit board 100*c* illustrated in FIG. 4.

The lower ground 190 shields the first signal line S1 and may allow the other signal line to be formed below the lower ground 190. That is, a multi-layered signal line may be formed.

Figure 6:
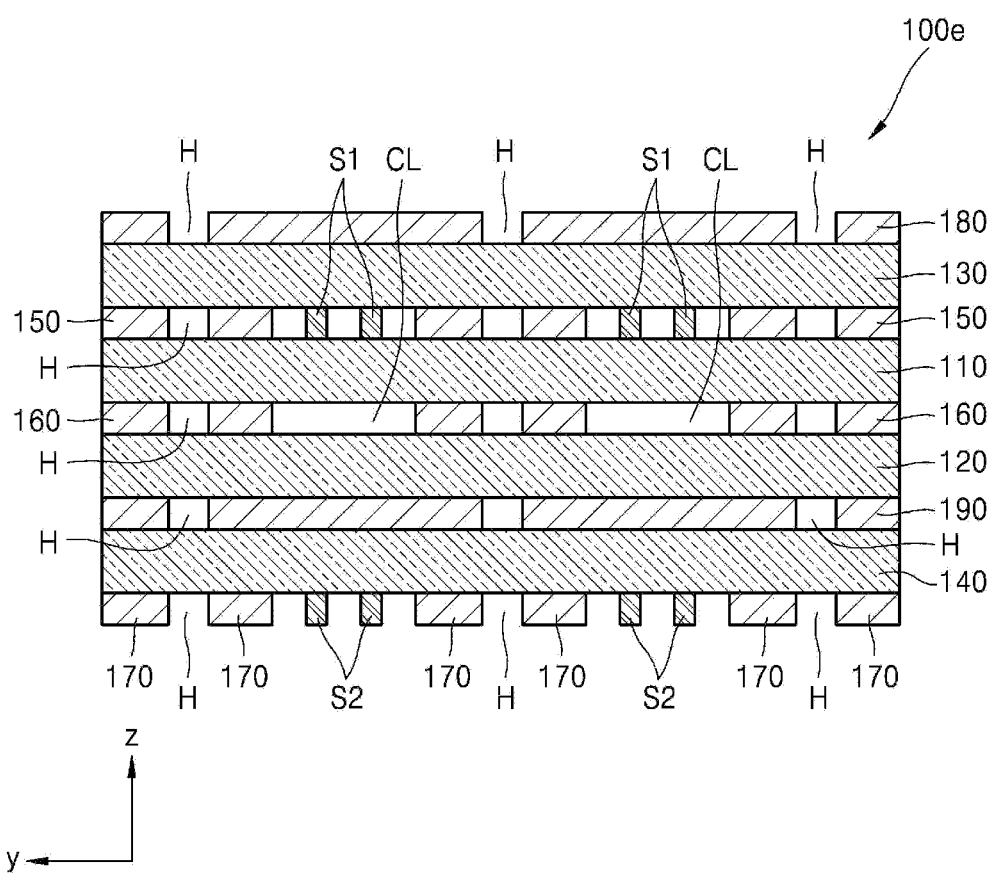
FIG. 6 is a cross-sectional view of a flexible circuit board 100*e* for multiple signal transmission according to an exemplary embodiment of the present disclosure.

FIG. 6 is a cross-sectional view of a flexible circuit board 100*e* for multiple signal transmission according to an exemplary embodiment of the present disclosure.

Referring to FIG. 6, as compared with the above-described flexible circuit board 100*d*, the flexible circuit board 100*e* for multiple signal transmission according to the exemplary embodiment may further include a fourth dielectric layer 140 formed on a bottom surface of the lower ground 190, a plurality of third side grounds 170 formed on the bottom surface of the fourth dielectric layer 140 to be parallel, and second signal lines S2 formed between the plurality of third side grounds 170.

The lower ground 190 allows the second signal line S2 to transmit a signal different from that of the first signal line S1 without causing interference due to the first signal line S1. The first signal line S1 and the second signal line S2 are formed on different layers to minimize the area of the flexible circuit board 100*e* for multiple signal transmission.

In the meantime, even though it is illustrated that the second signal line S2 is disposed below the first signal line S1 in FIG. 6, the present disclosure is not limited thereto. Regardless of the placement of the first signal line S1, the second signal line S2 may be independently disposed from the first signal line S1. That is, the second signal line S2 may not be disposed on the same z axis line same as the first signal line S1.

According to an exemplary embodiment, a plurality of through holes H which is formed with intervals along the length direction of the third side grounds 170 may be formed in each of the third side grounds 170.

The plurality of through holes H is formed in each of the third side grounds 170 formed between the second signal lines S2 so that the thermal expansion of the third side grounds 170 is restricted. Specifically, the appearance change of the third side grounds 170 by the thermal expansion of the third side grounds 170 may be minimized, which may prevent the conduction.

According to the exemplary embodiment, each of the second signal lines S2 may be formed by one or two or more signal lines. When each second signal line S2 is formed by two or more signal lines, even though there is a problem in signal transmission through one signal line, the signal may be transmitted through the other signal line.

According to an exemplary embodiment of the present disclosure, one of the first signal line S1 and the second signal line S2 is a signal line for high speed signal transmission and the other one may be a signal line for low speed signal transmission.

The first signal line S1 and the second signal line S2 may perform different functions. For example, a signal line for high speed signal transmission (for example, 10 GHz differential line), between the first signal line S1 and the second signal line S2, may transmit a high speed signal of 1 Gbps or higher and a signal line for low speed signal (for example, a control differential line or a control single line) may transmit a low speed signal of 1 Gbps or lower.

According to an exemplary embodiment, when it is assumed that a connector connected to a digital signal processing unit or an RF signal processing unit is disposed above the flexible circuit board 100e, the first signal line S1 close to the connector is a signal line for high speed signal transmission and the second signal line S2 far from the connector may be a signal line for low speed signal transmission.

In another exemplary embodiment, when the connector is disposed below the flexible circuit board 100e, the second signal line S2 close to the connector may be a signal line for high speed signal transmission and the first signal line S1 far from the connector may be a signal line for low speed signal transmission.

By making a high speed signal transmission path the shortest distance in this way, a signal transmission performance of the flexible circuit board 100e for multiple signal transmission may be improved.

Figure 7:
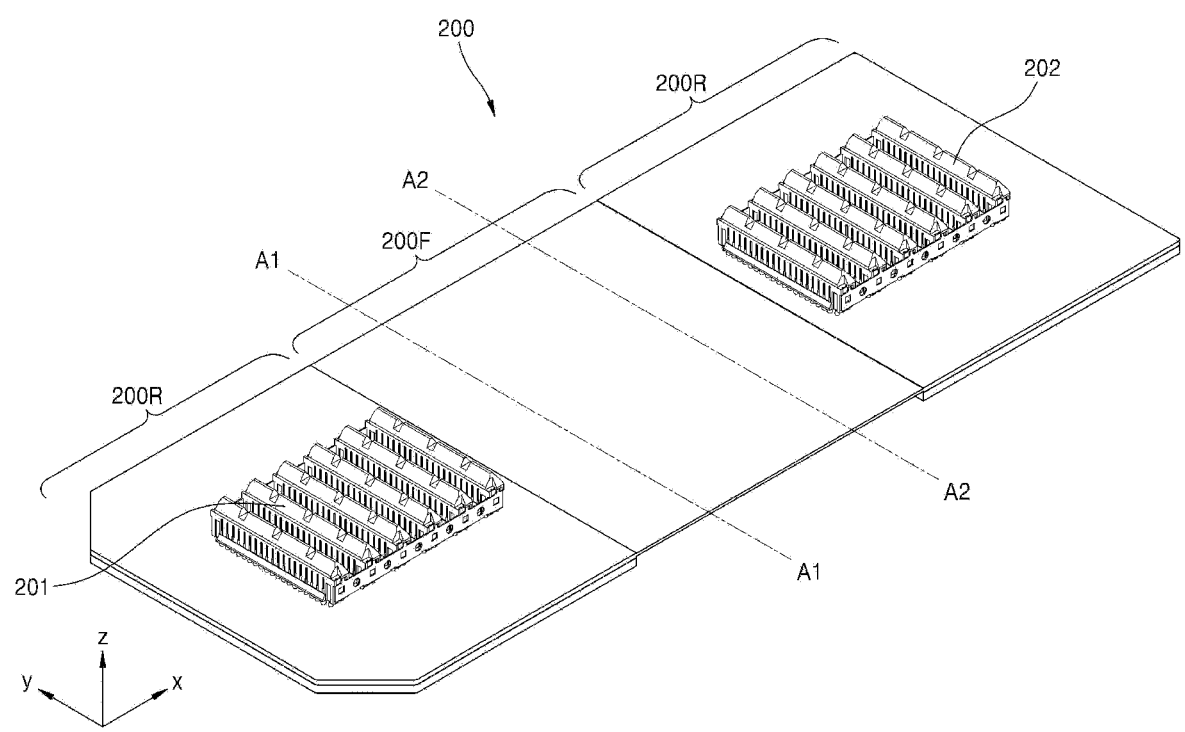
FIG. 7 is a perspective view of a multiple signal transmission device 200 according to an exemplary embodiment of the present disclosure.

FIG. 7 is a perspective view of a multiple signal transmission device 200 according to an exemplary embodiment of the present disclosure.

Referring to FIG. 7, a multiple signal transmission device 200 according to an exemplary embodiment may include a flexible part 200F and rigid parts 200R on both ends of the flexible part 200F. The flexible part 200F may include the flexible circuit board 100, 100a, 100b, 100c, 100d, or 100e according to various exemplary embodiments as described above.

According to an exemplary embodiment, the rigid parts 200R may be formed by bonding another layer having a high strength on both ends extending from the flexible part 200F.

A first connector 201 and a second connector 202 may be formed on the rigid parts 200R on both ends of the flexible part 200F, respectively. The flexible part 200F may include a flexible circuit board (for example, the flexible circuit board 100, 100a, 100b, 100c, 100d, or 100e) including signal lines (for example, the first signal line S1 and/or the second signal line S2) which connects the first connector 201 and the second connector 202.

One of the first connector 201 and the second connector 202 may be connected to the digital signal processing unit and the other one is connected to the RF signal processing unit. Accordingly, the first signal line S1 may perform transmission and reception between the digital signal processing unit and the RF signal processing unit. At this time, the first signal line S1 formed on the flexible circuit board is used, instead of the coaxial cable, so that the signal transmission device may be miniaturized.

Figure 8:
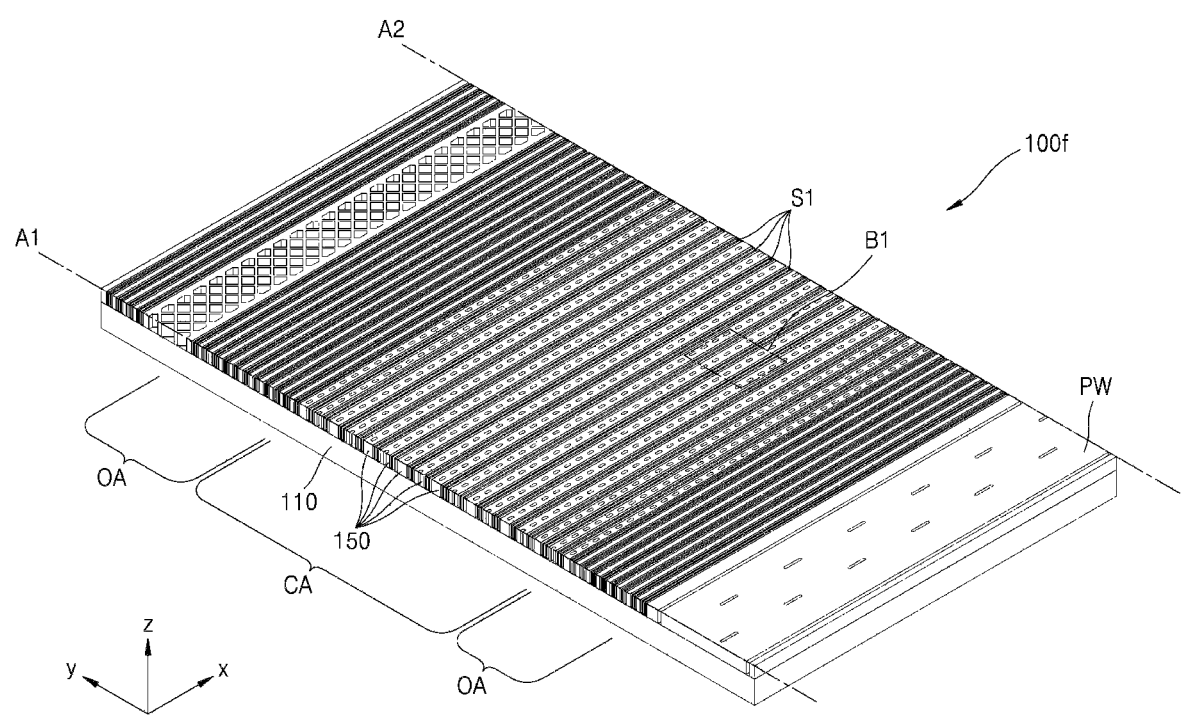
FIG. 8 is an internal enlarged view of an area between A1 and A2 of a multiple signal transmission device 200 illustrated in FIG. 7.

FIG. 8 is an internal enlarged view of an area between A1 and A2 of a multiple signal transmission device 200 illustrated in FIG. 7. That is, the flexible part 200F of the multiple signal transmission device 200 may include a flexible circuit board 100f. The flexible circuit board 100f includes a first dielectric layer 110, a first signal line S1, and first side grounds 150. According to an embodiment, the flexible circuit board 100f illustrated in FIG. 8 may include the flexible circuit board 100 illustrated in FIG. 1 and peripherals thereof. That is, the flexible circuit board 100f of FIG. 8 may be an extension of the flexible circuit board 100 of FIG. 1.

However, the flexible part 200F of the multiple signal transmission device 200 according to various embodiments of the present disclosure is not limited to the flexible circuit board 100f. The flexible part 200F of the multiple signal transmission device 200 according to various embodiments of the present disclosure may further include one or more of the second side ground 160, the second dielectric layer 120, the third dielectric layer 130, the upper ground 180, the lower ground 190, the fourth dielectric layer 140, the second signal line S2, and the third side ground 170, as described above, as well as the first dielectric layer 110, the first signal line S1, and the first side ground 150.

According to an embodiment, first signal lines S1 disposed in a central area CA of the flexible circuit board 100f are signal lines for high speed signal transmission and first signal lines S1 disposed in an outer area OA of the flexible circuit board 100f are signal lines for low speed signal transmission.

The signal lines for high speed signal transmission, among the first signal lines S1, are disposed in the central area CA of the flexible circuit board 100f to make the high speed signal transmission path the shortest distance. By doing this, the performance of the multiple signal transmission device 200 may be improved.

According to an embodiment, an interval between the signal lines for high speed signal transmission may be larger than an interval between signal lines for low speed signal transmission.

According to an embodiment, among the plurality of first side grounds 150, a width of the first side ground 150 formed between the signal lines for high speed signal transmission is larger than a width of the first side ground 150 formed between the signal lines for low speed signal transmission.

According to the above-described embodiments, the interval between the high speed signal lines is formed to be larger than the interval between the low speed signal lines so that the width of the first side ground 150 between the high speed signal lines may be formed to be large. Therefore, the reliability for high speed signal transmission may be maintained.

According to an embodiment, through holes H are formed in the first side ground 150 formed between the signal lines for high speed signal transmission, among the plurality of first side grounds 150, but through holes H are not formed in the first side ground 150 formed between the signal lines for low speed signal transmission, among the plurality of first side grounds 150.

The width of the first side ground 150 between the low speed signal lines is formed to be narrower than the width of the first side ground 150 between the high speed signal lines so that the through hole H is not formed in the first side ground 150 formed between the low speed signal lines to minimize the entire width of the flexible circuit board 100f.

In the meantime, a power transmission line PW may be formed at one side of the first signal lines S1.

In the meantime, as described above, according to various embodiments, the multiple signal transmission device 200 may further include a third dielectric layer 130 facing one surface of the first dielectric layer 110 and an upper ground 180 formed on one surface of the third dielectric layer 130. That is, the multiple signal transmission device 200 according to various embodiments may include the above-described flexible circuit board 100c, 100d, or 100e.

FIG. 9 is a top view of an upper ground 180 according to an exemplary embodiment of the present disclosure. The upper ground 180 illustrated in FIG. 9 may be disposed above the flexible circuit board 100f illustrated in FIG. 8. Referring to FIG. 9, a plurality of through holes H may be formed on the upper ground 180.

Hereinafter, a positional relationship of the first signal line S1 and the upper ground 180 will be described with reference to an area B1 illustrated in FIG. 8 and an area B2 illustrated in FIG. 9.

Figure 10:
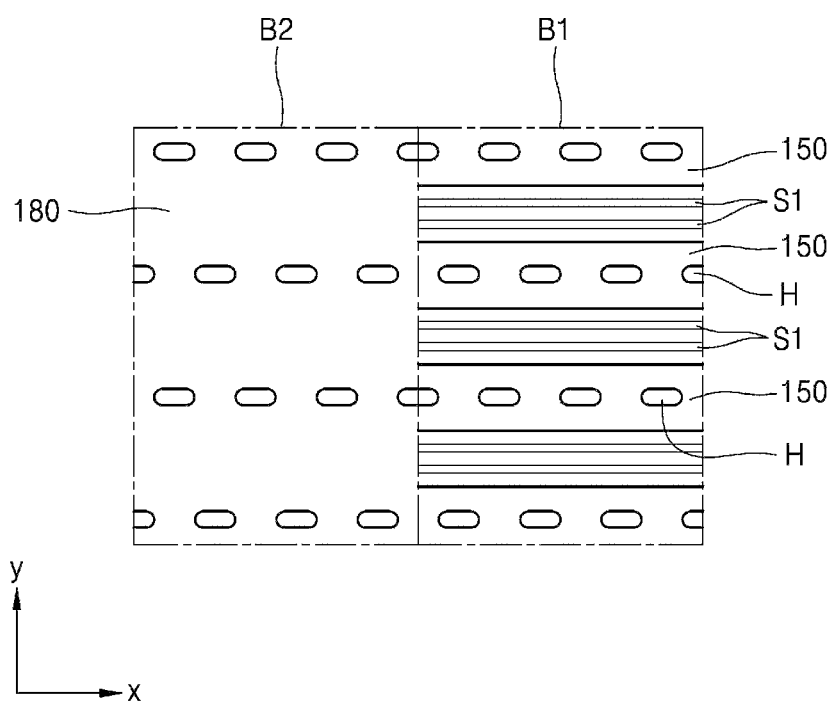
FIG. 10 is a top view illustrating a state in which an area B2 of an upper ground 180 according to an exemplary embodiment of the present disclosure covers only a part of an area B1 including first signal lines S1 and first side grounds 150.

FIG. 10 is a top view illustrating a state in which an area B2 of an upper ground 180 according to an exemplary embodiment of the present disclosure covers only a part of an area B1 including first signal lines S1 and first side grounds 150. The area B1 and the area B2 are illustrated in FIGS. 8 and 9, respectively.

Referring to FIG. 10, in an embodiment, the through holes H may not be formed in a portion of the upper ground 180 on the area where the first signal line S1 is formed. Further, the through holes H may be formed in a portion of the upper ground 180 on an area where the first signal line S1 is not formed.

Since the through holes H is not formed in the portion of the upper ground 180 on the area where the first signal line S1 is formed to help the shielding of the first signal line S1. Further, the through holes H are formed in a portion of the upper ground 180 on an area where the first signal line S1 is not formed to minimize the thermal expansion of the upper ground 180.

In the meantime, the positional relationship of the second signal line S2 and the lower ground 190 may correspond to a positional relationship of the first signal line S1 and the upper ground 180.

The plurality of through holes H is formed on the lower ground 190, but the through holes H may not be formed in a portion of the lower ground 190 on the area where the second signal line S2 is formed. Further, the through holes H may be formed in a portion of the lower ground 190 on an area where the second signal line S2 is not formed.

Since the through holes H is not formed in the portion of the lower ground 190 on the area where the second signal line S2 is formed to help the shielding of the second signal line S2. Further, the through holes H are formed in a portion of the lower ground 190 on an area where the second signal line S2 is not formed to minimize the thermal expansion of the lower ground 190.

The present disclosure has been described with reference to the exemplary embodiment illustrated in the drawing, but the exemplary embodiment is only illustrative, and it would be appreciated by those skilled in the art that various modifications and modification of the embodiment may be made. Therefore, the true technical scope of the present should be defined by the technical spirit of the appended claims.

[DESCRIPTION OF REFERENCE NUMERALS]

| | |
|---|---|
| 100, 100a, 100b, 100c, 100d, 100e, 100f: flexible circuit board | |
| 110: first dielectric layer | 120: second dielectric layer |
| 130: third dielectric layer | 140: fourth dielectric layer |
| 150: first side ground | 160: second side ground |
| 170: third side ground | 180: upper ground |
| 190: lower ground | S1: first signal line |
| S2: second signal line | H: through hole |
| CL: cavity line | 200: multiple signal transmission device |
| 200F: flexible part | 200R: rigid part |
| 201: first connector | 202: second connector |
| PW: power transmission line | CA: central area |
| OA: outer area | |

We claim:

1. A flexible circuit board for multiple signal transmission, comprising:
    a first dielectric layer;
    a plurality of first side grounds formed on one surface of the first dielectric layer to be parallel;
    a plurality of first signal lines formed between the plurality of first side grounds; and
    a plurality of through holes which is formed in each of the plurality of first side grounds with an interval, along a length direction of the first side grounds,
    a plurality of second side grounds formed on a bottom surface of the first dielectric layer to be overlap with the plurality of first side grounds;
    a second dielectric layer formed on bottom surfaces of the plurality of second side grounds; and
    cavity lines formed between the plurality of second side grounds to be overlap with the plurality of first signal lines,
    wherein one area of one surface, among surfaces of the first dielectric layer, on which the first side ground is formed is exposed through the plurality of through holes, and
    wherein each of the cavity lines is an empty space formed to be surrounded by the first dielectric layer, the second dielectric layer and the plurality of second side grounds adjacent to each other.

2. The flexible circuit board for multiple signal transmission of claim 1, wherein each of the plurality of first signal lines is formed by one or two or more signal lines.

3. The flexible circuit board for multiple signal transmission of claim 1, wherein each of the plurality of through holes has a slit shape elongating along the length direction.

4. The flexible circuit board for multiple signal transmission of claim 1, wherein the plurality of through holes formed in at least one of the plurality of first side grounds is disposed in one line.

5. The flexible circuit board for multiple signal transmission of claim 1, wherein centers of through holes formed in an arbitrary first side ground and centers of through holes formed in the other first side ground adjacent to the arbitrary first side ground are not disposed on the same straight line parallel to the width direction of the first side ground.

6. The flexible circuit board for multiple signal transmission of claim 1, wherein the second side grounds are formed below an area where the first side grounds are formed, along the length direction and cavity lines are formed below an area where the first signal lines are formed.

7. The flexible circuit board for multiple signal transmission of claim 6, wherein a plurality of through holes is formed in each of the second side grounds along the length direction with an interval therebetween.

8. The flexible circuit board for multiple signal transmission of claim 1, wherein the cavity lines include at least two cavity lines which are spaced apart from each other with respect to a direction intersecting a length direction of the first signal line.

9. The flexible circuit board for multiple signal transmission of claim 1, wherein the second side grounds are formed below an area where the first side grounds are formed, along a length direction of the first side grounds, and the cavity lines are formed to extend along a length direction of the first signal line.

10. The flexible circuit board for multiple signal transmission of claim 1, further comprising:

a third dielectric layer facing one surface of the first dielectric layer; and an upper ground formed on one surface of the third dielectric layer.

11. The flexible circuit board for multiple signal transmission of claim 10, wherein a plurality of through holes is formed on the upper ground.

12. The flexible circuit board for multiple signal transmission of claim 11, wherein the through holes are not formed in a portion of the upper ground on the area where the first signal line is formed and the through holes are formed in a portion of the upper ground on an area where the first signal line is not formed.

13. The flexible circuit board for multiple signal transmission of claim 1, further comprising:

a lower ground formed on a bottom surface of the second dielectric layer.

14. The flexible circuit board for multiple signal transmission of claim 13, further comprising:

a fourth dielectric layer formed on a bottom surface of the lower ground;

a plurality of third side grounds formed on a bottom surface of the fourth dielectric layer to be parallel; and a plurality of second signal lines formed between the plurality of third side grounds.

15. The flexible circuit board for multiple signal transmission of claim 14, wherein a plurality of through holes is formed in each of the plurality of third side grounds along the length direction with an interval therebetween.

16. The flexible circuit board for multiple signal transmission of claim 14, wherein each of the plurality of second signal lines is formed by one or two or more signal lines.

17. The flexible circuit board for multiple signal transmission of claim 14, wherein a plurality of through holes is formed on the lower ground, through holes are not formed in a portion of the lower ground on an area where the plurality of second signal lines is formed, and through holes are formed in a portion of the lower ground on an area where the plurality of second signal lines is not formed.

18. The flexible circuit board for multiple signal transmission of claim 14, wherein one of the plurality of first signal lines and the plurality of second signal lines is a signal line for high speed signal transmission and the other one is a signal line for low speed signal transmission.

19. The flexible circuit board for multiple signal transmission of claim 1, wherein both ends of the plurality of first signal lines are connected to a digital signal processing unit and an RF signal processing unit, respectively.

20. The flexible circuit board for multiple signal transmission of claim 1, wherein a plurality of first signal lines disposed in a central area of the flexible circuit board is signal lines for high speed signal transmission and a plurality of first signal lines disposed in an outer area of the flexible circuit board is signal lines for low speed signal transmission.

21. The flexible circuit board for multiple signal transmission of claim 20, wherein intervals between the signal lines for high speed signal transmission are larger than intervals between the signal lines for low speed signal transmission.

22. The flexible circuit board for multiple signal transmission of claim 20, wherein a width of a first side ground formed between the signal lines for high speed signal transmission, among the plurality of first side grounds, is larger than a width of a first side ground formed between the signal lines for low speed signal transmission.

23. The flexible circuit board for multiple signal transmission of claim 20, wherein the through holes are formed in the first side ground formed between the signal lines for high speed signal transmission, among the plurality of first side grounds, and the through holes are not formed in the first side ground formed between the signal lines for low speed signal transmission, among the plurality of first side grounds.

* * * * *